United States Patent [19]
Funakoshi et al.

[11] Patent Number: 5,495,116
[45] Date of Patent: Feb. 27, 1996

[54] HIGH SENSITIVITY, BROAD BAND CHARGE DETECTING APPARATUS WITH SUPPRESSION OF MIXING OF NOISE

[75] Inventors: Hiromasa Funakoshi; Takahiro Yamada, both of Hirakata, Japan

[73] Assignee: Matsushita Electric Industrial Co., Ltd., Osaka, Japan

[21] Appl. No.: 67,133

[22] Filed: May 26, 1993

[30] Foreign Application Priority Data

May 26, 1992 [JP] Japan .................................. 4-133231
Jun. 19, 1992 [JP] Japan .................................. 4-160725

[51] Int. Cl.⁶ ........................ H01L 27/148; H01L 29/768
[52] U.S. Cl. .......................... 257/239; 257/249; 257/250; 257/300
[58] Field of Search ................................ 257/239, 249, 257/250, 300

[56] References Cited

U.S. PATENT DOCUMENTS

| 4,266,237 | 5/1981 | Hendrickson | 257/239 |
| 4,668,971 | 5/1987 | Hynecek | 357/24 |
| 5,192,990 | 3/1993 | Stevens | 257/239 |

FOREIGN PATENT DOCUMENTS

| 62-244174 | 10/1987 | Japan | 257/239 |
| 2-262344 | 10/1990 | Japan . | |

OTHER PUBLICATIONS

White et al., "Characterization of Surface Channel CCD Image Arrays at Low Light Levels", IEEE Journal of Solid-State Circuits, vol. SC-9, No. 1 (Feb. 1974).

*Primary Examiner*—Ngân V. Ngô
*Attorney, Agent, or Firm*—Willian Brinks Hofer Gilson & Lione

[57] ABSTRACT

An electric charge detecting apparatus comprising vertical CCD, horizontal CCD and floating diffusion amplifier comprised of floating diffusion layer and source follower amplifier comprising a MOS transistor wherein a buffer electrode is arranged at one end of a gate electrode of the MOS transistor, the gate electrode is formed within an active region of the MOS transistor, a contact hole is provided for connecting a polysilicon layer arranged on a charge-voltage transformer and the source follow or plural P wells are formed and one of them is arranged under a wiring connecting the charge-voltage transformer and the source follower and connected to a source of a drive transistor. Said electric charge detecting apparatus further comprising, P⁺ region arranged under a field oxide film on which an output signal wiring from the source follower is electrically isolated from another P⁺ region or no P⁺ regions are provided under the field oxide film.

2 Claims, 14 Drawing Sheets

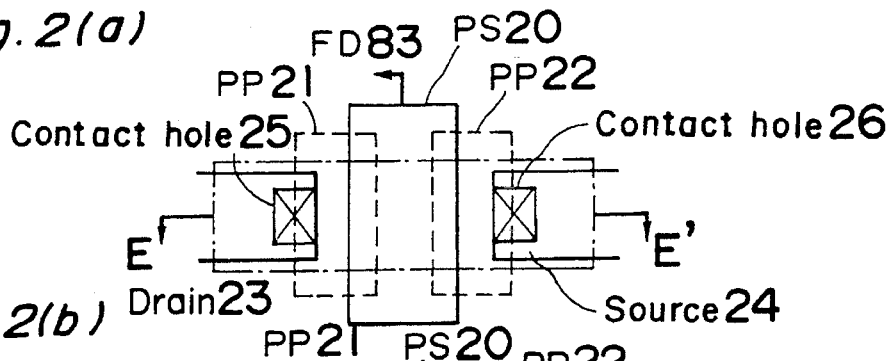
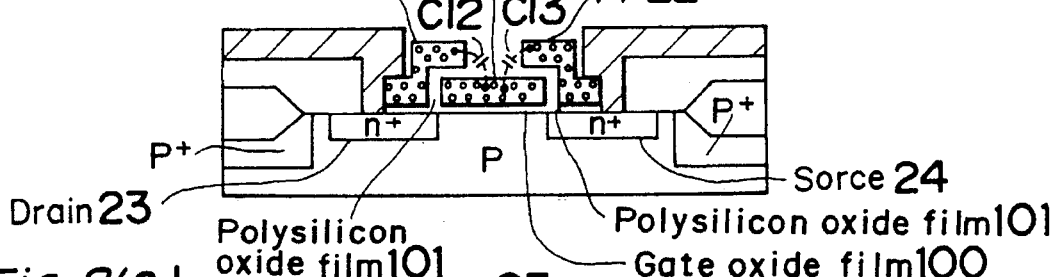
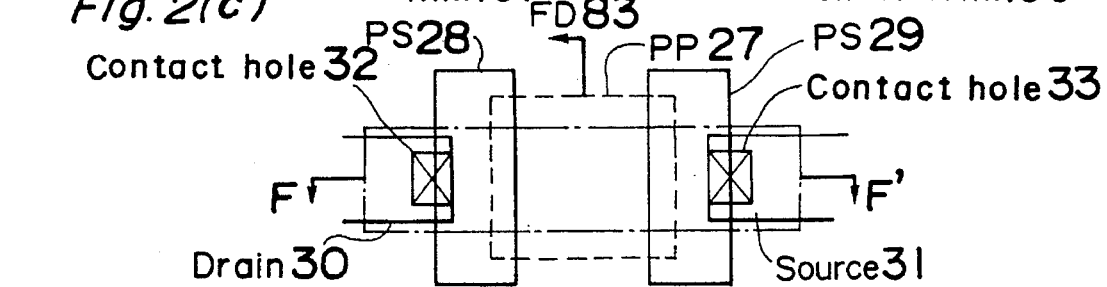
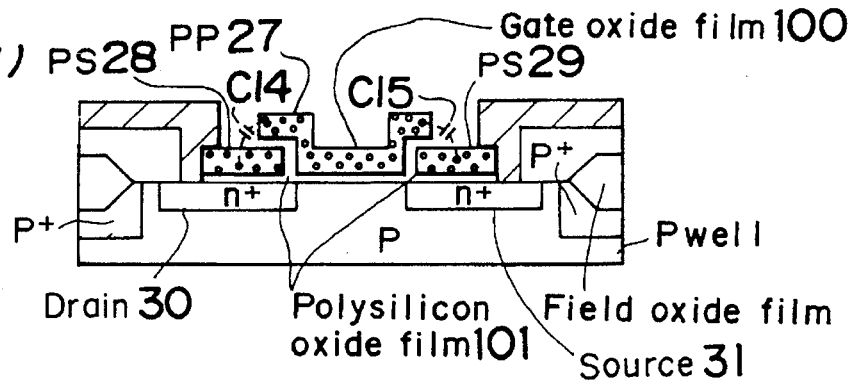

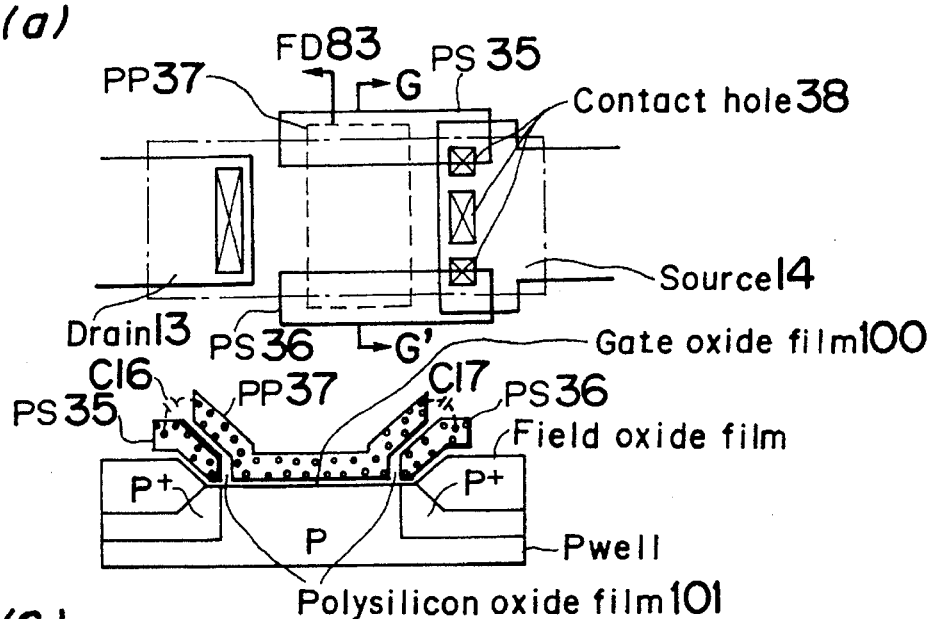
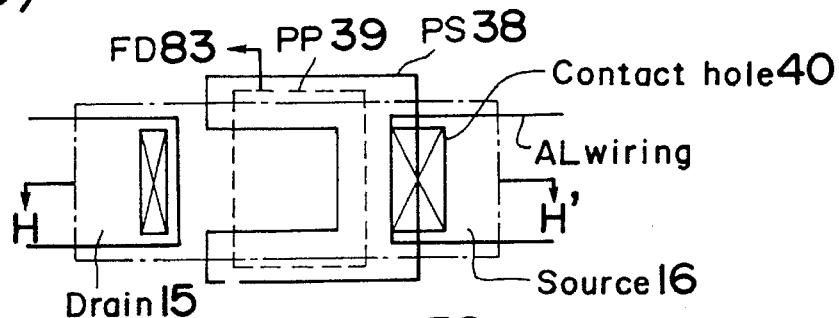
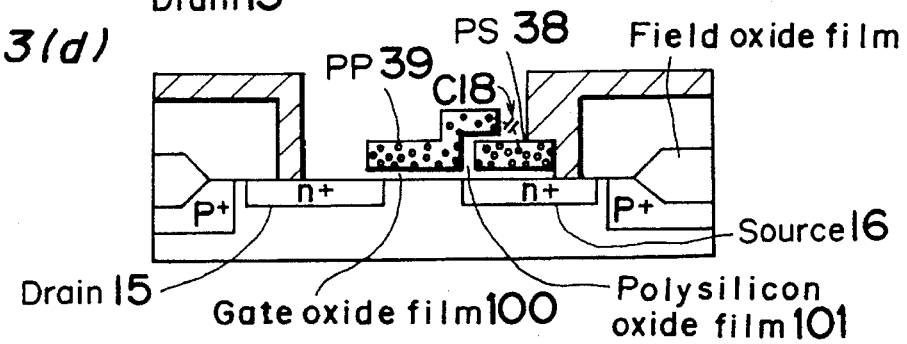

HIGH SENSITIVITY, BROAD BAND CHARGE DETECTING APPARATUS WITH SUPPRESSION OF MIXING OF NOISE

BACKGROUND OF THE INVENTION

1. Field of the Invention

The present invention relates to an electric charge detecting apparatus which performs charge-voltage conversion in a charge-coupled device (referred to as a CCD hereinafter).

2. Description of the Prior Art

In a conventional CCD, a signal charge has been detected by a so-called floating diffusion method (depicted as an FD method hereinafter), thereby to generate an output.

More specifically, the potential change has been detected by means of a floating diffusion amplifier by injecting signal charges into a floating diffusion layer according to the floating diffusion method. The floating diffusion amplifier is generally denoted by FDA which is described in "Characterization of Surface Channel CCD" by Marvin H. White, IEEE Journal of Solid-State Circuits, Vol. SC-9, No. 1, 1974, pp. 1–13.

FIGS. 11(a) and 11(b) illustrate the structure of a conventional charge transfer device. FIG. 11(a) is a block diagram of the whole CCD. Photons entering a photodiode PD90 are converted to electric charges and accumulated in PD90. A predetermined time later, the electric charges are read out by a VCCD91 (Vertical CCD) and input to an FDA93 (Floating Diffusion Amp.) through an HCCD92 (Horizontal CCD), and finally detected as a voltage. FIG. 11(b) is a sectional view along A—A' line of FIG. 11(a). HCCD92 in FIG. 11(a) is formed of a P well 81, an n layer 88, n⁺ regions FD83 and RD86, a p⁻ region 89 and a p⁺ layer all laminated on an n-type substrate 80, and polysilicon electrodes on the laminate via a gate oxide film 82. FDA93 is constituted of an FD83 and a source follower amplifier SFA87. The electric charge ΔQ is input from HCCD92 to FD83 through an output gate OG84. Supposing that the parasitic capacitance present between FD83 and SFA87 is represented by $C_T$ and the gain of SFA87 is $G_T$, the potential change ΔV is expressed by an expression (1) below:

$$\Delta V = G_T \cdot Q/C_T \quad (1)$$

A reset pulse synchronized with a φH signal is input to an RG85. A constant voltage $V_{RD}$ is impressed to an RD86. The electric charge ΔQ input to FD83 is discharged to RD86 in accordance with the reset pulse of RG85.

FIG. 12(a) is a plan view of a general MOS transistor, and cross sections thereof along the lines A—A' and B—B' are indicated respectively in FIGS. 12(b) and 12(c). Referring to FIG. 12(b), a field oxide film 206 is a thick film obtained by a local oxidation method of silicon (LOCOS), and generally 0.5–1.0 μm (5000–10000Å) thick. In the transistor of FIG. 12, after a gate 96, a source 94 and a drain 95 are formed, interlayer films of BPSG, NSG or the like (not shown) are laminated, and then contact holes 97, 98 are opened by etching. The source 94 is connected with the drain 95 by an aluminum wiring.

The P⁺ region of the field oxide film 206 undesirably spreads further than in the initial state, as shown in FIG. 12(b), due to the thermal oxidation. Thereby, a capacitance Cb exists between the polysilicon gate 96 and P⁺ region. A gate oxide film 208 is 500–700Å thick, and the field oxide film 206 is 5000–10000Å thick. When the transistor operates, a channel 200 is constructed and therefore, a capacitance C6 is present also between the gate 96 and the channel 200. There is an overlap capacitance C7 between the gate 96 and the channel 200 at the drain side, which will be re-defined as a capacitance Cd. A source capacitance Cs is the sum of an overlap capacitance C5 and the capacitance C6. FIG. 13 is a diagram explanatory of the parasitic capacitance. Although SFA87 is constructed in two stages, only the first stage is shown in the drawing for the convenience of description. The parasitic capacitance is constituted as follows:

$$C_T = C1 + C2 + C3 + C4 + C_{Tr} \quad (2)$$

$$C_{Tr} + Cd + Cs \cdot (1-G1) + Cb \quad (3)$$

$$C_L + C_{Tr2} + C_{dL} + C_{Js} \quad (4)$$

wherein C1 and C2 are capacitances between FD83 and OG84 and between FD83 and RG85, C3 is a capacitance between FD83 and the P well 81, C4 is a capacitance of the wiring from FD83 to the drive transistor Tr in the first stage, G1 is a gain of the source follower in the first stage, and $C_{Tx}$ is an input capacitance from the drive transistor. In other words, the expression (3) represents that the capacitance Cs is lowered by nearly one digit because of the gain G1 (G1, G2=approximately 0.8–0.95), whereby $C_{Tr}$, $C_T$ are decreased. $C_{Js}$ is a capacitance between the diffusion region at the source side of the drive transistor Tr and the P well 81, $C_{dL}$ is a capacitance between a gate and a drain (working also as a source of the drive transistor Tr) of a load transistor Tr, and $C_L$ is a load capacitance necessary to be driven by the source follower.

In the above-described constitution, there still remain such problems yet to be solved as 1) the parasitic capacitance and 2) mixing of noises into output signals, which will be depicted hereinbelow;

1) Parasitic capacitance:

The sensitivity should be improved in order to prevent the decrease of the saturated charges when the pixels are turned considerably fine, and therefore $C_T$ in the expression (1) should be eliminated. Moreover, it is also important to eliminate the parasitic capacitance so as to improve the frequency characteristic. Therefore, the parasitic capacitance, particularly, the overlap capacitance at the drain side should be eliminated to improve the sensitivity and the frequency characteristic. Besides, the PN junction capacitance and the wiring capacitance are required to be reduced to improve the sensitivity.

2) Mixing of noises into output signals:

FIG. 14 is a sectional view showing the vicinity of the source follower and FIG. 15 is an equivalent circuit diagram of CCD. Only the first stage of the circuit is indicated in FIG. 15 for brevity's sake.

The PN junction capacitance is proportional to a contact hole 119 which is approximately 1.21*1.2 μm² at minimum at present, from the viewpoint of the stability of the process. Although the CCD part and FDA are separated by a field oxide film, actually they are not insulated because they use the P well in common. As is understood from FIG. 14, in a general CCD, FDA and VCCD, HCCD share the P well. That is, driving signals from VCCD, HCCD are mixed into an output signal Vo of FDA. Referring to FIG. 15, when signals are added to φVi–φV4, φH1, φH2, the signals are impressed to the P well 81 through C31–C36. The influences when the potential of the P well 81 is scattered by the P well resistance and C20–C30 appear through C37–C40 of FDA. The changing component acts as noises, with inviting the S/N deterioration in the succeeding stage or inferior operation of CDS.

The output signals are mixed also on a signal wiring. FIG. 16 is a sectional view of a signal wiring part and an equivalent circuit diagram thereof. Generally, a signal line is formed of aluminum and wired on a field oxide film 212, as illustrated in FIGS. 16(a) and 16(b). The AL layer is generally 1 μm thick, and the distance from the AL wiring to a $P^+$ layer below the field oxide film 212 is also about 1 μm. The distance between signal lines is approximately 10–20 μm depending on the design of the mask, and each signal line is approximately 10 μm wide. Assuming that S is the area of the overlap portion, ∈ is the dielectric constant of the oxide film, and d is the thickness of the oxide film, a capacitance C is represented by an expression (5) as follows;

$$C = \epsilon \cdot S/d \quad (5)$$

Therefore, C51–C53 are almost negligible in comparison with C41–C44 in the equivalent circuit of FIG. 16(b). The driving signals of φH1, φH2, RG, φV1–φV4 (not shown) are transmitted to the $P^+$ layer (including the P well) through C41, C42, C44. Thereafter, as the P well resistance and C51–C54 take part, the P well potential is scattered and the signals are mixed into the output signal Vo through C43. This phenomenon is impossible to be prevented in the conventional example using the field oxide film.

SUMMARY OF THE INVENTION

The object of the present invention is therefore to provide an electric charge detecting apparatus for detecting electric charges with high sensitivity in a broad band while suppressing mixing of noises, with eliminating the disadvantages inherent in the prior art. The present charge detecting apparatus with little mixing of noises is realized in the constitution below:

1. A buffer electrode is provided at both ends or one end of a gate electrode;
2. A gate electrode is formed only in the active region of the transistor;
3. The actual area of the PN junction is reduced by forming a contact hole to connect polysilicon on a voltage converter means with a source follower;
4. A plurality of P wells are provided under a wiring connecting the voltage converter means and the source follower, to be connected with a source of the drive transistor in the source follower, whereby the parasitic capacitance is reduced; and
5. $P^+$ region under a field oxide film on which an output signal line from the source follower is wired is separated from other $P^+$ region or no $P^+$ region is provided, whereby mixing of noises is effectively suppressed.

According to the present invention, the parasitic capacitance can be effectively eliminated in a simple constitution. Therefore, a highly sensitive, broad-band charge detecting apparatus is achieved. The decrease of saturating charges when the pixels are rendered fine is compensated, whereby a CCD of high resolution such as an HDTV or the like is easily realized. Moreover, mixing of the other signals is reduced by separating the P wells, thus enabling reliable CDS operation with high S/N ratio. The charge detecting apparatus of the present invention is superior in sensitivity and low noise characteristic in a broad band, and therefore considerably effective in practical use.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 2(a) is an enlarged plan view of a Tr used in an electric charge detecting apparatus according to Embodiment 3 of the present invention;

FIG. 2(b) is a sectional view along the line E—E' in FIG. 2(a);

FIG. 2(c) is an enlarged plan view of a Tr used in an electric charge detecting apparatus according to Embodiment 4 of the present invention;

FIG. 2(d) is a sectional view along the line F—F' in FIG. 2(c);

FIG. 3(a) is an enlarged plan view of a Tr used in an electric charge detecting apparatus according to Embodiment 5 of the present invention;

FIG. 3(b) is a sectional view along the line G—G' in FIG. 3(a);

FIG. 3(c) is an enlarged plan view of a Tr used in an electric charge detecting apparatus according to Embodiment 6 of the present invention;

FIG. 3(d) is a sectional view along the line H—H' in FIG. 3(d);

DETAILED DESCRIPTION OF THE PREFERRED EMBODIMENTS

Figure 1A:
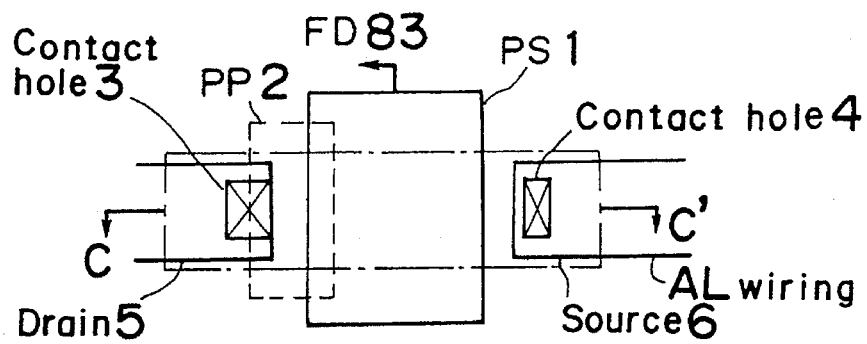
FIG. 1(a) is an enlarged plan view of a Tr used in an electric charge detecting apparatus according to Embodiment 1 of the present invention.
Figure 1B:
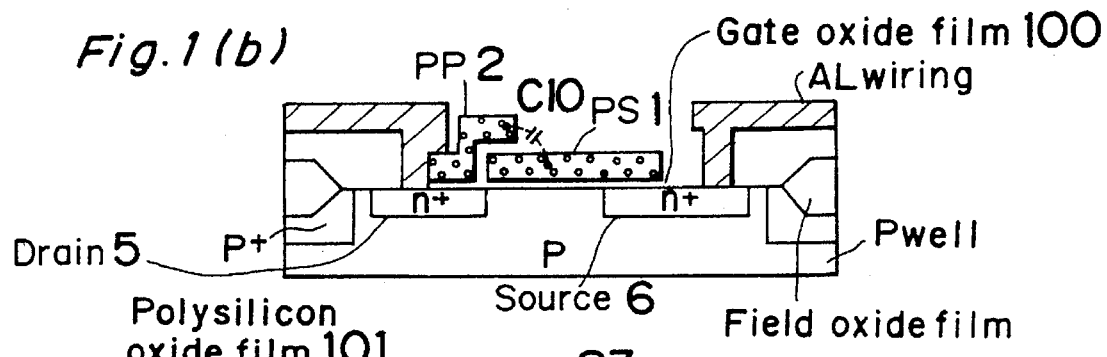
FIG. 1(b) is a sectional view along the line C—C' in FIG. 1(a)
Figure 12A:
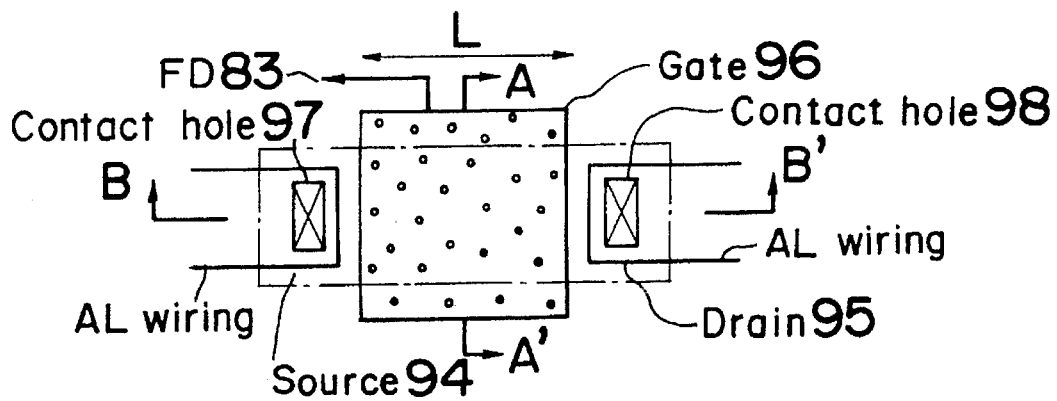
FIG. 12(a) is an enlarged plan view of a Tr used in the conventional electric charge detecting apparatus.
Figure 12B:
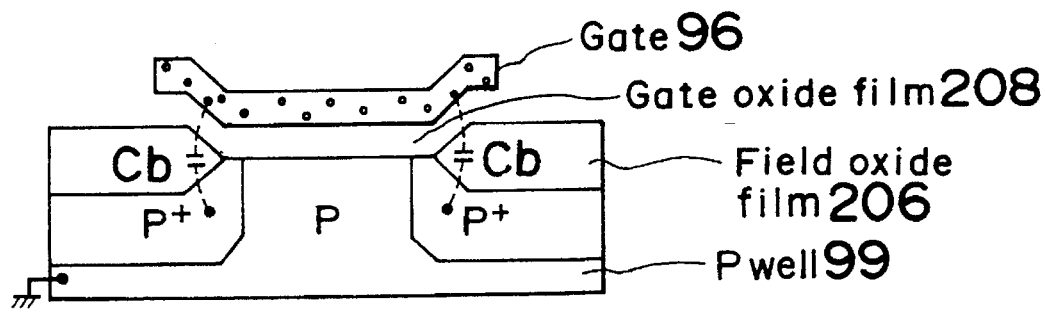
FIG. 12(b) is a sectional view along the line A—A' in FIG. 12(a)
Figure 12C:
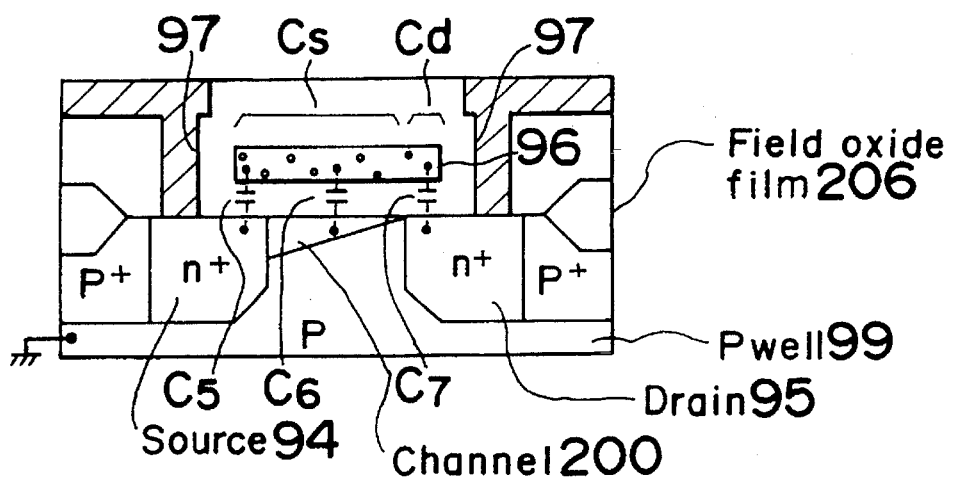
FIG. 12(c) is a sectional view along the line B—B' in FIG. 12(a)

FIGS. 1(a) and 1(b) show enlarged views of a Tr part in an electric charge detecting apparatus according to Embodiment 1 of the present invention. FIG. 1(a) is a plan view and FIG. 1(b) is a sectional view taken along the line C—C' of FIG. 1(a). After a gate PS1 is formed of a first polysilicon layer (PS) on a gate oxide film 100, a polysilicon oxide film 101 is obtained on the surface of the gate PS1 through thermal oxidation. Then, a gate PP2 is formed of a second polysilicon layer (PP). At this time, since the polysilicon oxide film 101 works as an insulating layer between the gates PS1 and PP2, the gates are electrically separated from each other. In Embodiment 1, the gate oxide film 100 is set to be 500–700Å thick, and the polysilicon oxide film 101 is made approximately 800–1100Å thick. The films are used in a region where the relationship, i.e., gate oxide film thickness<polysilicon oxide film thickness is held. A drain 5 and a source 6 are formed by diffusing Phosphorus and Arsenic. A contact hole 3 is formed to connect the drain 5 with the gate PP2. A contact hole 4 connects the source 6 with an AL wiring. Since it is a thermal process when the drain and the source are formed by diffusion, P and As are spread by approximately 0.7–1.0 μm. The gate PP2 is designed to project outside the gate PS1 as the above spread is taken into consideration. The overlap capacitance of the gate PS1 and the drain 5 is accordingly considerably small. Although the drain and the source may be formed by injection of ions, the succeeding thermal process (to form contact holes or the like) invites the spread as well. In a conventional method, parasitic capacitances C5, C7 are present between the gate 96 and the diffusion region (source, drain) as shown in FIG. 12(c). On the other hand, in Embodiment 1 shown in FIG. 1(b), a capacitance corresponding to the conventional C7 is not present at the drain side and the gate PP2 is connected with the drain 5, and therefore another capacitance C10 is added between the gates PS1 and PP2. The gate PP2 is connected with the drain 5 without any capacitance therebetween. The overlapping amount of polysilicon between PS1 and PP2 is 0.2–0.3 μm, and the polysilicon oxide film 101 is about 800–1100Å thick. Since the overlapping amount of PS1 and the diffusion region is 0.7–1.0 μm and the oxide film under the gates is 500–700Å thick in Embodiment 1, C7>C10 is held according to the expression (5). In other words, the problem pending heretofore, namely, the parasitic capacitance at the drain side is eliminated in Embodiment 1. The input gate capacitance of Tr from the FD part is greatly reduced, thereby improving not only the sensitivity, but the frequency characteristic. Although the formation of the drain and source and the formation of contact holes are separately described hereinabove, the drain and source, and the contact holes may be formed in one process. Since the contact hole 3 is formed to overlap with PP2, P and As, entering from the end of PP2, are spread to the end of PS1 by thermal diffusion. Therefore, the width of PP2 should be set considering this fact. If the contact hole 4 is disposed to be separated from the gate PS1, the overlapping amount with PS1 is decreased because P and As are spread by heat. That is, when Embodiment 1 is applied, one diffusion becomes enough although A, Ps are diffused twice in the conventional method in order to form the drain and source and the contact holes (to connect with the AL wiring). The process is accordingly simplified.

Figure 1C:
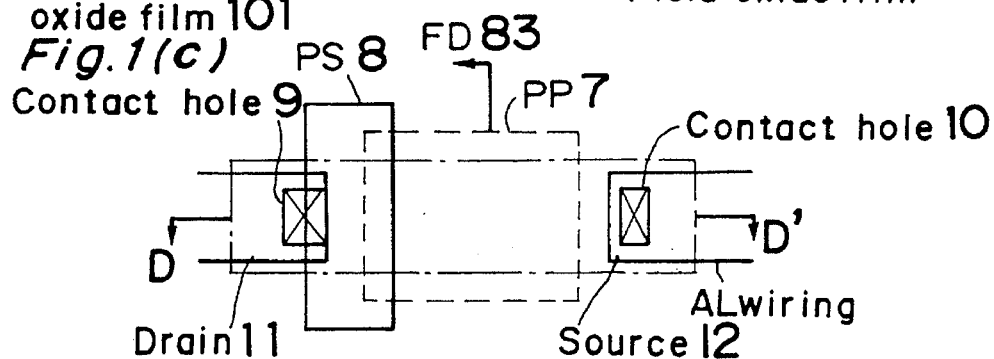
FIG. 1(c) is an enlarged plan view of a Tr used in an electric charge detecting apparatus according to Embodiment 2 of the present invention.
Figure 1D:
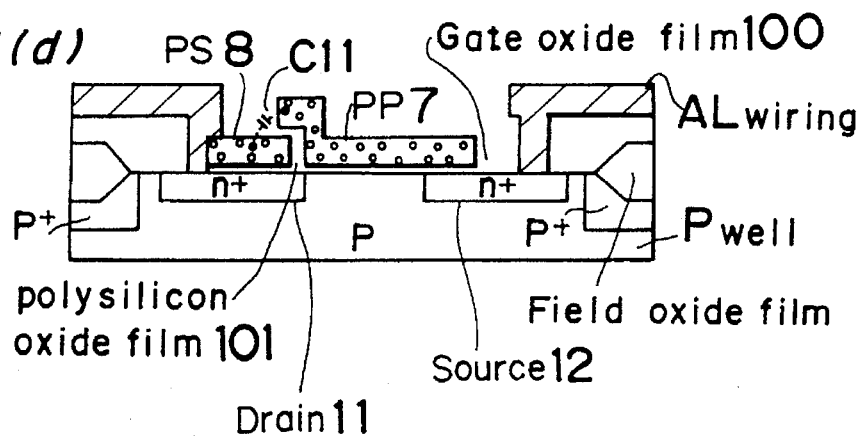
FIG. 1(d) is a sectional view along the line D—D' in FIG. 1(c)

FIGS. 1(c) and 1(d) are enlarged views of the Tr part in an electric charge detecting apparatus according to Embodiment 2 of the present invention. FIG. 1(c) is a plan view and FIG. 1(d) is a sectional view taken along the line D—D' of FIG. 1(c). The same parts as in Embodiment 1 are designated by the same reference numerals. A gate PS8 is formed of a first polysilicon layer (PS) on a gate oxide film 100 and then a polysilicon oxide film 101 is formed through oxidation of polysilicon. Subsequently, a gate PP7 is formed of a second polysilicon layer (PP). A source 12 and a drain 11 are formed in the same manner as in Embodiment 1 through diffusion of P and As. A contact hole 9 connects the gate PS8 with the drain 11, while a contact hole 10 connects the source 12 with the gate PP7 via an AL wiring. Although the drain 11 and source 12 are spread due to the thermal diffusion, the gate PS8 is allowed to project outside the gate PP7 with the spread taken into consideration, so that the overlap capacitance between the gates PS8 and PP7 is remarkably reduced. A fresh capacitance C11 is generated between the gates PP7 and PS8 in Embodiment 2. Nevertheless, the parasitic capacitance is eliminated as a whole because C7>C11 is satisfied, similar to Embodiment 1. Accordingly, the input gate capacitance of Tr from the FD part is greatly reduced and, both the sensitivity and the frequency characteristic are improved in the simplified process, FIGS. 2(a) and 2(b) are enlarged views of a Tr part in an electric charge detecting apparatus according to Embodiment 3 of the present invention, FIG. 2(a) being a plan view and FIG. 2(b) being a sectional view along the line E—E' of FIG. 2(a). A gate PS20 of a first polysilicon layer is formed on a gate oxide film 100. After oxidation of polysilicon, gates PP21, PP22 are formed of a second polysilicon layer. A polysilicon oxide film 101 is formed by oxidation of the first polysilicon layer. The gate PP21 is connected with a drain 23 through a contact hole 25, and the gate PP22 is connected with a source 24 through a contact hole 26 via an AL wiring. In this Embodiment 3, there is provided the second polysilicon gate PP22 at the source side, thereby making it possible to eliminate the overlap capacitance at the source side as well as at the drain side. The drain and source regions are spread by the thermal diffusion. The gates PP21 and PP22 project outside the gate PS20 by the amount of the spread, thus reducing the overlap capacitance. Although capacitances C12, C13 are generated, C7>C12 and C5>C13 and therefore, the parasitic capacitance is eliminated as a whole. Since the drain and source regions are formed in a manner of self alignment in Embodiment 3, the contact holes 25 and 26 are obtained at one time. Accordingly, the efficiency is stabilized and the process is simplified.

FIGS. 2(c) and 2(d) are enlarged views of a Tr part in an electric charge detecting apparatus in Embodiment 4 of the present invention. FIG. 2(c) is a plan view and FIG. 2(d) is a sectional view along the line F—F' in FIG. 2(c). Gates PS28 and PS29 are formed of a first polysilicon layer on a gate oxide film 100 and subjected to oxidation. Thereafter, a gate PP27 is formed of a second polysilicon layer. Due to the oxidation of the first polysilicon layer, a polysilicon oxide film 101 is formed. The gate PS28 and a drain 30 are connected by a contact hole 32, and the gate PS29 is connected with a source 31 by a contact hole 33 via an AL wiring. In Embodiment 4, the gate PS29 of the second polysilicon layer is formed also at the source side, so that the overlap capacitance can be eliminated at the source side as well as at the drain side. Since the length L of each gate PS28 and PS29 is set corresponding to the amount of the spread of the drain and source, the overlap capacitance is quite small. Although capacitances C14 and C15 are generated in Embodiment 4, similar to Embodiments 1–3, since C7>C14 and C5>C15, the parasitic capacitance is reduced as a whole. Moreover, the source and drain are formed in the same process as when the contact holes are formed, thereby simplifying the process.

In Embodiments 1–4, the gates PS1, PP7, PS20, PP27 are connected to FD83 of the conventional example. Each of the gates PP2, PS8, PP21, PP22, PS28, PS29 works as a buffer electrode.

FIGS. 3(a) and 3(b) are enlarged views of a Tr part in an electric charge detecting apparatus according to Embodiment 5 of the present invention. A plan view is shown in FIG. 3(a), and a sectional view along the line G—G' is indicated in FIG. 3(b). After gates PS35 and PS36 are formed of a first polysilicon layer on a gate oxide film 100, a polysilicon oxide film 101 is formed, and a gate PP37 is constituted of a second polysilicon layer. Contact holes 38 connect the gates PS35 and PS36 to a source 14. In the conventional constitution, the parasitic capacitance Cb is present between the gate and the P$^+$ region at the end of the field oxide film as shown in FIG. 12(b). In this case, the main component of the capacitance Cb is the capacitance between the polysilicon gate and the P$^+$ region below the gate oxide film 100 which is 500–700Å thick. The polysilicon oxide film 101 is approximately 800–1100Å. In Embodiment 5, since the polysilicon gates PS35 and PS36 are provided separately below the gate PP37 of the transistor, the capacitance Cb between the gate PP37 and P$^+$ region disappears, and the other parasitic capacitances C16 and C17 are generated between the gates PS35 and PP37, and between the gates PS36 and PP37, respectively. Cb>C16 and Cb>C17 based on the relative thickness of the oxide films. Since the gates PS35 and PS36 are connected to the source 14, the capacitances C16 and C17 assume the capacitance Cs between the gate and the source. As described by expression (3), supra, the source capacitance Cs between the gate and source is multiplied (1–G1) times, thus the source capacitance's influence on the input capacitance is controlled by G1 (G1 is the gain of a source follower in the first stage). Therefore, in Embodiment 5, not only the capacitances C16 and C17 are decreased more than the capacitance Cb, but the source capacitance's influence on the input capacitance can be reduced through manipulation of the gain of the source follower. Although the capacitance Cb disappears between the gate PP37 and P$^+$ layer, capacitances present between PS35 and the P$^+$ layer and between PS36 and the P$^+$ layer. As such, the capacitance Cb is incorporated in the capacitance $C_L$ to be driven by the source follower which is represented in the expression (4). However, the frequency characteristic is hardly influenced because of the relationship $C_L \gg Cb$.

FIGS. 3(c) and 3(d) are enlarged views of a Tr part in an electric charge detecting apparatus according to Embodiment 6 of the present invention. FIG. 3(c) is a plan view and FIG. 3(d) is an H—H' sectional view. A gate PS38 is formed of a first polysilicon layer on a gate oxide film 100 and a polysilicon oxide film 101 is formed through oxidation of the first polysilicon layer. Subsequently, a gate PP39 is formed of a second polysilicon layer. A contact hole 40 connects the gate PS38 with a source 16 via an AL wiring. The difference from Embodiment 5 is that the gates PS35 and PS36 of Embodiment 5 are formed of an integral polysilicon layer, as is the gate PS38, however, the gates PS35 and PS36 are separated from each other. In Embodiment 6 similar to Embodiments 1–4, the gate PS38 projects outside the gate PP39 of the transistor by the amount of the spread of the diffusion region. Therefore, although a capacitance C18 is added as a capacitance between the gates PP39 and PS38, the overlap capacitance at the source side (n$^+$ layer) of the gate PP39 is almost removed, and the parasitic capacitance of the gate PP39 is reduced as a whole. The reason for this is, as described in Embodiments 1–5, the difference of the thickness of the gate oxide film 100 and the polysilicon oxide film 101. Since the gate PS38 is connected at the source side, the capacitance between the gates PP39 and PS38 is regarded as the capacitance Cs between the gate and source. The capacitance Cs influences the input capacitance by a factor of (1–G1) based on the gain G1 of the source follower (expression (3), supra). According to Embodiment 6, since the overlapping amount between the gate and source is reduced much more than in Embodiment 5, the capacitance Cs is further lowered. In Embodiments 5 and 6, the gates PP37 and PP39 are connected to FD83 of the conventional example. Moreover, the gates PS35, PS36, PS38 serve as buffer electrodes.

Figure 4A:
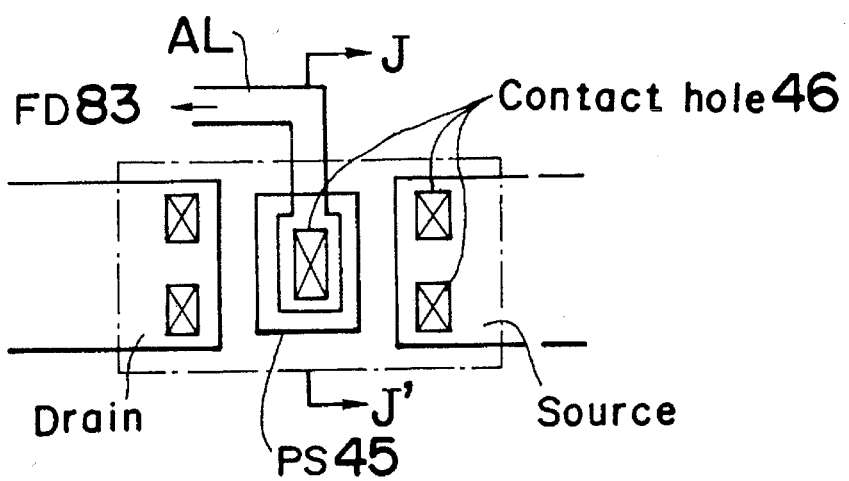
FIG. 4(a) is an enlarged plan view of a Tr used in an electric charge detecting apparatus according to Embodiment 7 of the present invention.
Figure 4B:
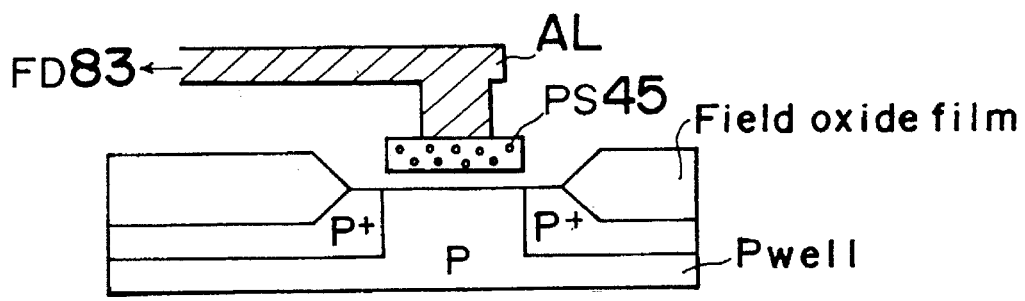
FIG. 4(b) is a sectional view along the line J—J' in FIG. 4(a)
Figure 4C:
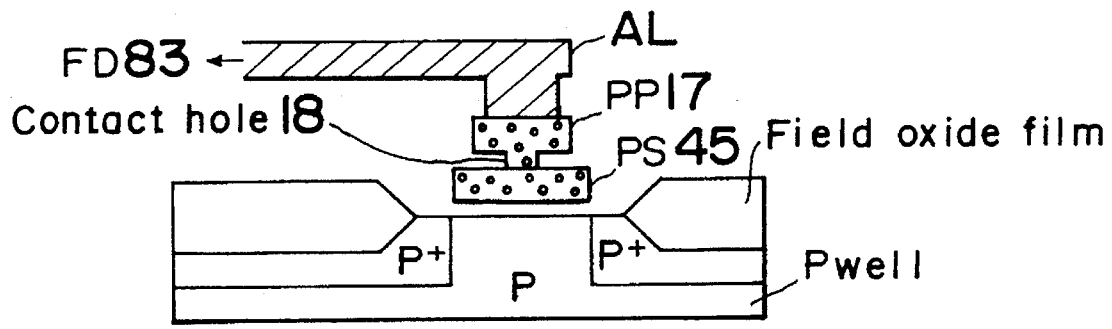
FIG. 4(c) is another example similar to FIG. 4(b)

FIG. 4(a) is an enlarged view of a Tr part in Embodiment 7 of the present invention. As shown in FIG. 12(b), the capacitance Cb exists between the polysilicon gate and P$^+$ region. In embodiment 7, the part of the polysilicon gate overlapping with the P$^+$ layer is removed. A gate PS45 is formed only in the active region to function as a transistor. A contact hole 46 is opened on the gate PS45 to be connected with an AL wiring. The gate length is not larger than 4 μm, which is enough to form the contact hole. In general, the AL wiring is used while tungsten silicide is arranged for a lower layer and aluminum is an upper layer. Therefore, even when the AL wiring is directly connected with the polysilicon gate PS45, it makes little influences to Vth (threshold value). In other words, polysilicon is not in direct contact with aluminum, but tungsten silicide is in touch with aluminum, so that the difference of the work functions is small. FIG. 4(c) illustrates a process to form a contact hole 18 at a part of the gate PS45 after oxidation of polysilicon of the gate PS45, and to form a gate PP17 of a second polysilicon layer on the contact hole 18. When a polysilicon gate is to be formed, generally, n-type impurities are doped to decrease the resistance. In the case of Embodiment 7, when n-type impurities are doped to the gate PP17, the gates PS45 and PP17 are electrically connected through the contact hole 18. Moreover, even when the gates PS45 and PP17 are connected with each other, no influences to Vth are observed in the absence of the difference of the work functions. The gate PP17 is connected with the AL wiring in the same fashion as in FIG. 4(b). In consequence, it becomes possible in Embodiment 7 to reduce the parasitic capacitance Cb between the gate and $P^+$ region.

Figure 5A:
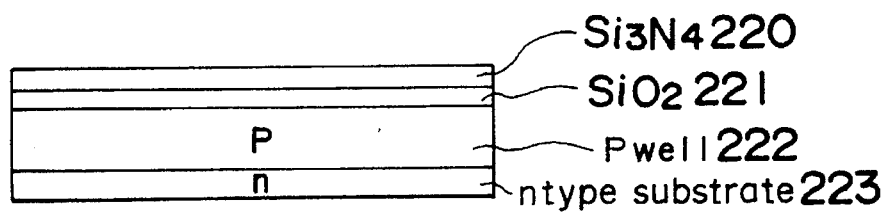
FIGS. 5(a), 5(b), 5(c) and 5(d) are a series of steps showing LOCOS process according to Embodiment 8 of the present invention.
Figure 5B:
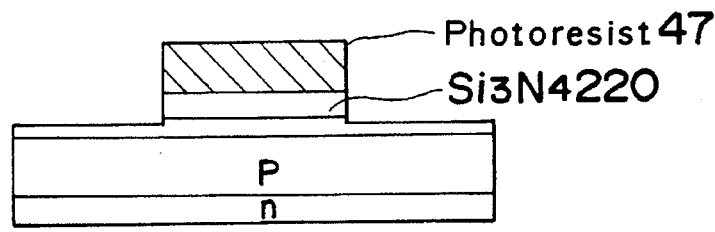
Figure 5C:
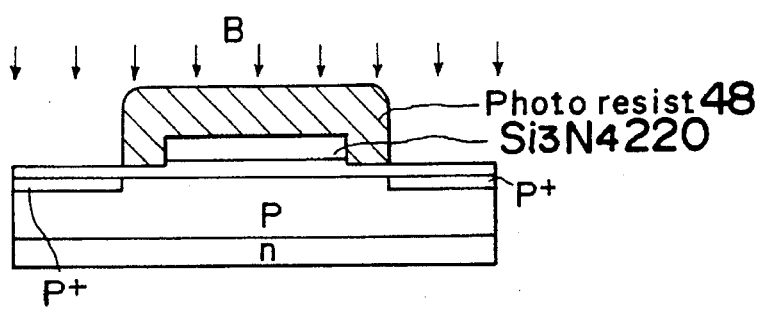
Figure 5D:
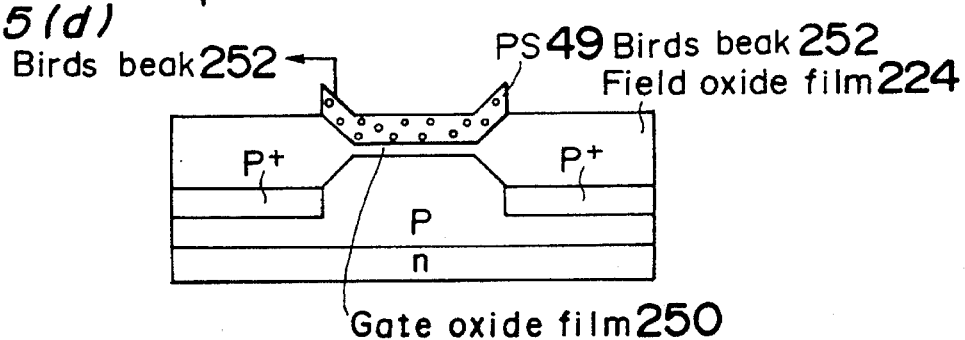
Figure 6A:
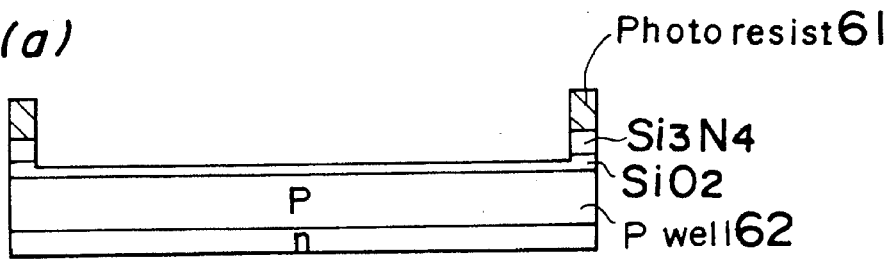
FIGS. 6(a), 6(b), 6(c) and 6(d) are a series of steps for forming signal wirings according to Embodiment 9 of the present invention.
Figure 6B:
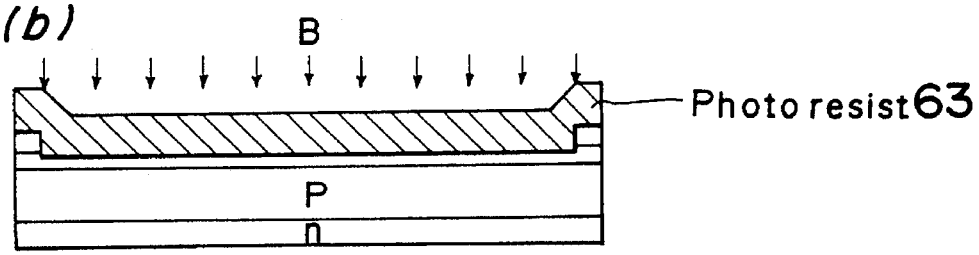
Figure 6C:
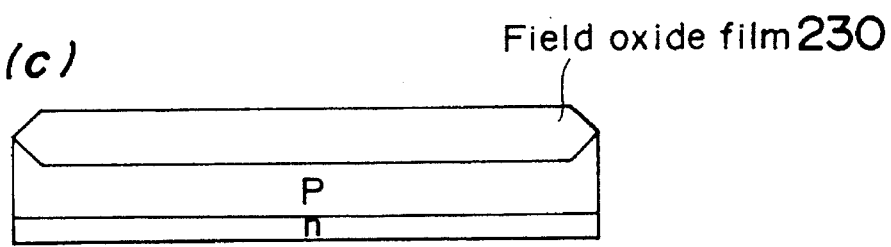
Figure 6D:
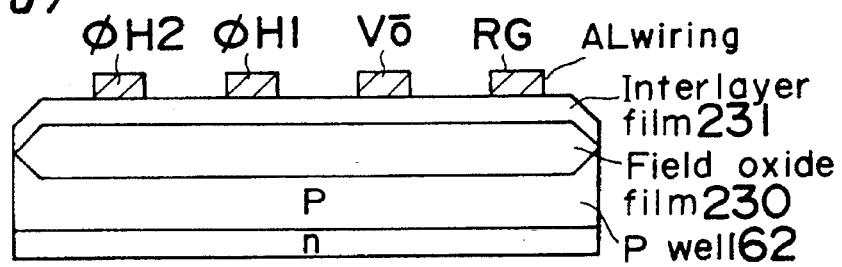

A LOCOS process according to Embodiment 8 of the present invention will be explained with reference to FIGS. 5(a) to 5(b). In FIG. 5(a), a P well 222 is formed on an n-type substrate 223, on which an SiO2 film 221 and an Si3N4 film 220 are sequentially layered. After a photoresist 47 is applied, exposure, development and etching are carried out to remove the resist of a part to be used as an active region (where CCD operates). Etching is intended to remove the Si3N4 film 220. The Si02 film 221 is partly removed so as to surely remove the Si3N4 film. The resultant state is shown in FIG. 5(b). After the photoresist 47 is removed, a photoresist 48 is applied, exposed and developed and boron B is injected, as indicated in FIG. 5(c). The resist 48 is left in a manner to enclose the remaining part of the Si3N4 film 220 of FIG. 5(b). In accordance with the following growth of the oxide film, a field oxide film 224 is formed where the Si3N4 film 220 is not present. The Si3N4 film 220 is removed and a gate PS49 is formed of a first polysilicon layer. FIG. 5(d) results. A birds beak 252 is a part protruding triangularly from the field oxide film 224. According to Embodiment 8, since the $P^+$ layer does not ride and spread over the end of the field oxide film 224 (birds beak 252), the source and the drain can be formed up to the end of the field oxide film 224. Therefore, the capacitance conventionally brought about between the $P^+$ layer protruding from the end of the field oxide film and the gate is eliminated. That is, the capacitance between the gate PS49 and $P^+$ layer (Cb in FIG. 12) can be considerably reduced. The gate PS49 works as a first stage transistor of the source follower, and therefore the input capacitance in the first stage can be decreased.

Figure 15:
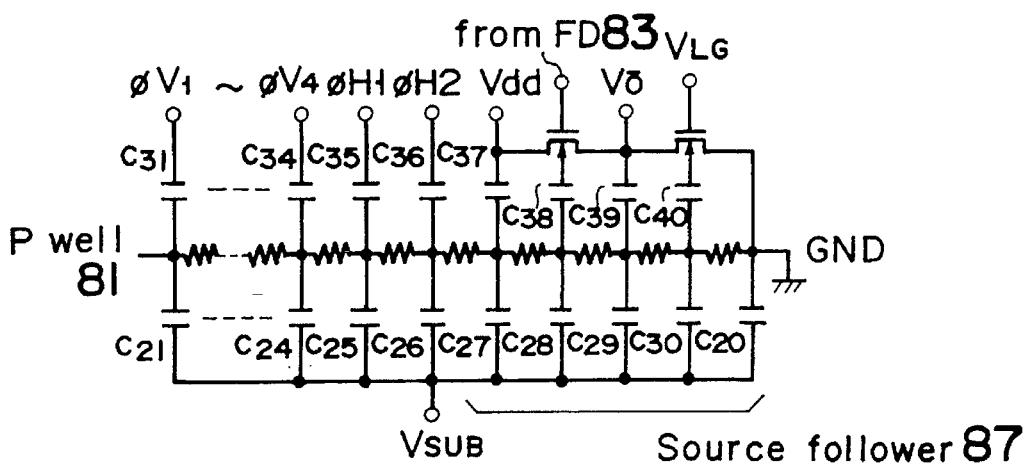
FIG. 15 is an equivalent circuit of a conventional charge coupled device.
Figure 16A:
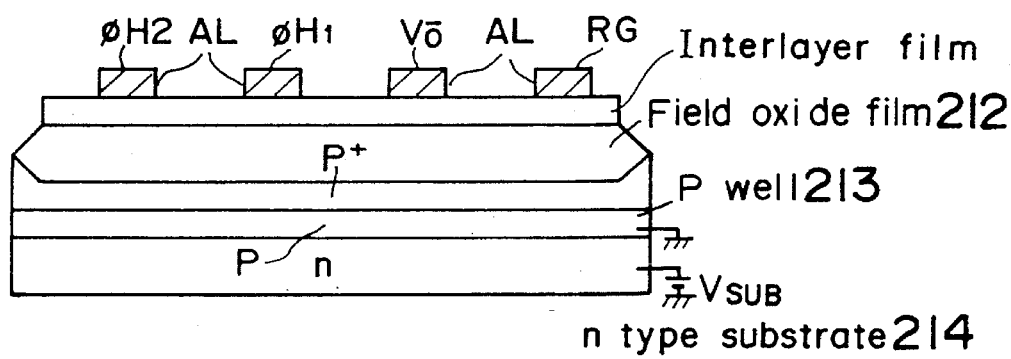
FIG. 16(a) is an enlarged sectional view of a signal wiring part of the conventional CCD.
Figure 16B:
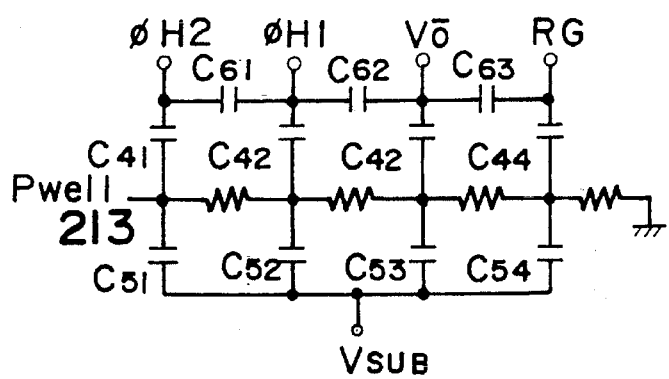
FIG. 16(b) is an equivalent circuit of the signal wiring part in the conventional CCD.

FIGS. 6(a) to 6(d) are sectional views of a signal wiring part in Embodiment 9 of the present invention, indicating a process to form the signal wiring part subsequent to the LOCOS process. As the pending problem to be solved has been described with reference to FIG. 15, C31–C40 in FIG. 15 should be decreased to avoid mixing of noises into output signals. In the same manner as in Embodiment 8, Si3N4 is etched (FIG. 6(a)) and a photoresist 61 is removed, then a photoresist 63 is applied, followed by the injection of boron B (FIG. 6(b)) for forming a $P^+$ region. At this time, since the signal wiring part is covered with the photoresist 63, boron B is not injected into the signal wiring part (FIG. 6(b)). Then, a field oxide film 230 is formed through oxidation (FIG. 6(c)), and an interlayer film 231 (of BSPG, NSG or the like) is laminated and an AL wiring is provided (FIG. 6(d)). In Embodiment 9, the part below the field oxide film 230 is changed from $P^+$ layer to P layer (P well 62). Therefore, the capacitance between the AL wiring and P layer (P well 62) is reduced approximately 30%, so that the CCD driving signals (RG, φH1, φH2, φVi–φV4) are less mixed into the output signal Vo.

Figure 7A:
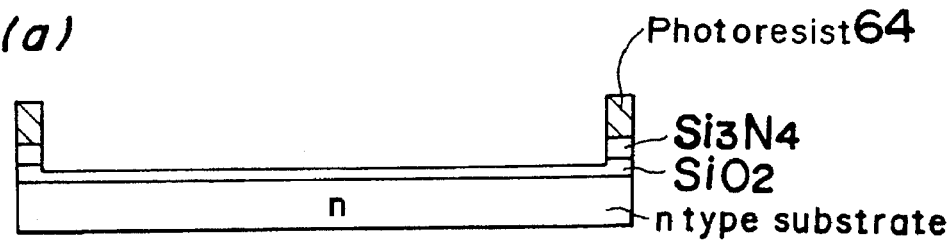
FIGS. 7(a), 7(b), 7(c) and 7(d) are a series of steps for forming signal wirings according to Embodiment 10 of the present invention.

FIGS. 7(a) to 7(d) are sectional views of a signal wiring part according to Embodiment 10 of the present invention, specifically, showing a process to form the signal wiring part after the LOCOS process. FIG. 7(a) indicates the same state as in Embodiment 9, but without the P well.

Figure 7B:
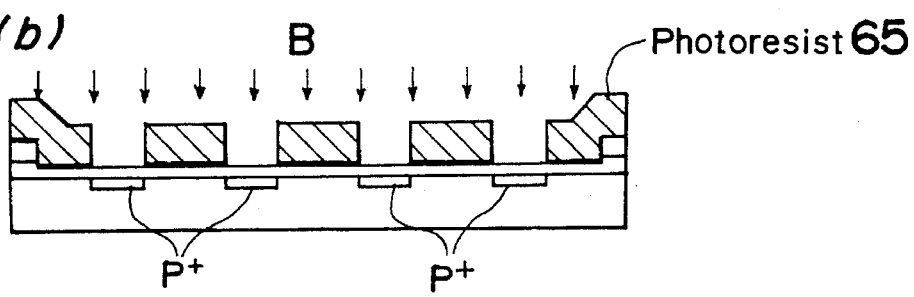
Figure 7C:
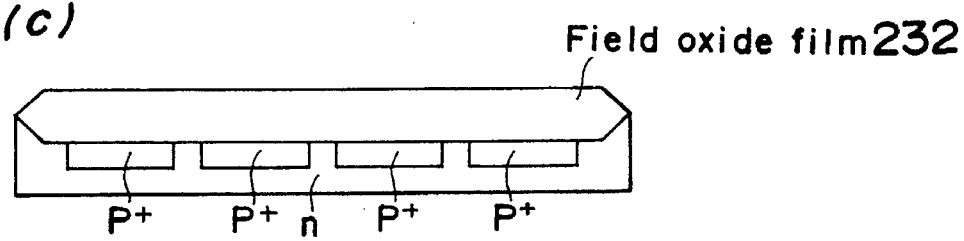
Figure 7D:
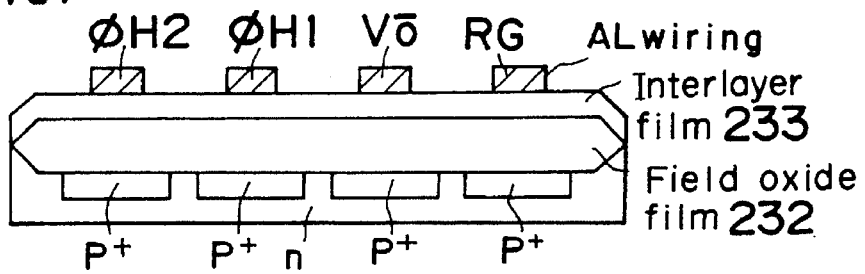

After a photoresist 64 is removed and a photoresist 65 is applied, exposed and developed, boron B is injected to an AL signal wiring part alone (FIG. 7(b)). When a field oxide film 232 is formed, the $P^+$ regions do not come in touch with each other although the regions actually spread (FIG. 7(c)). An interlayer film 233 is laminated and thereafter, an AL wiring is provided. Accordingly, since the $P^+$ regions are separated from each other under the signal wiring, CCD driving signals (RG, φH1, φH2, φVi–φV4) are mixed less with the output signal Vo.

Figure 8A:
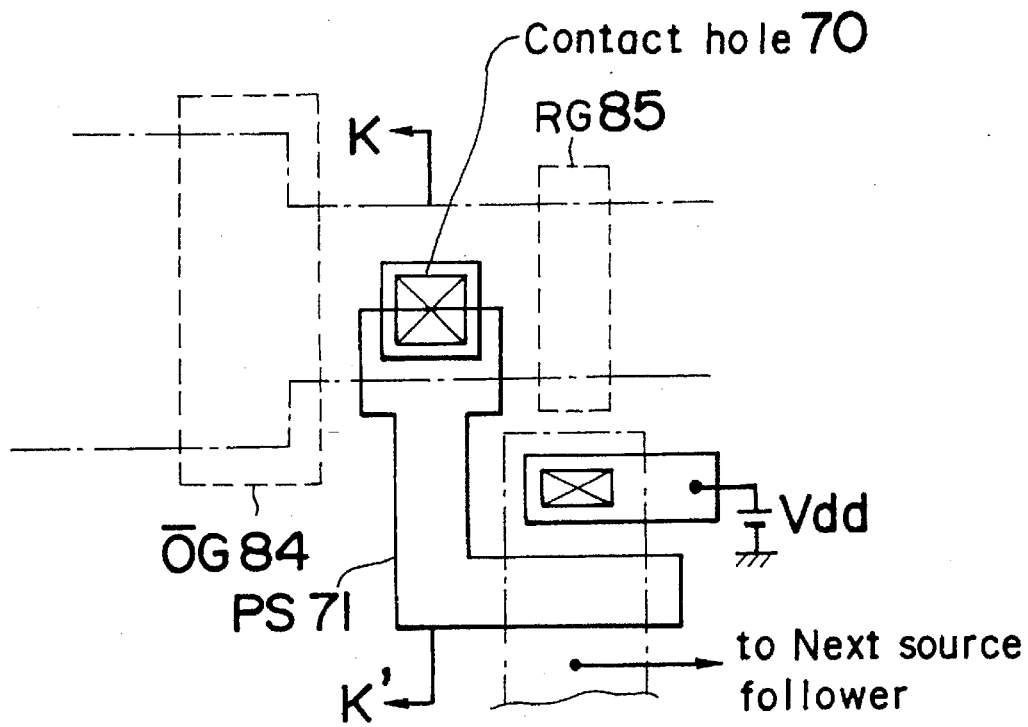
FIG. 8(a) is an enlarged plan view of a floating diffusion part in an electric charge detecting apparatus according to Embodiment 11 of the present invention.
Figure 8B:
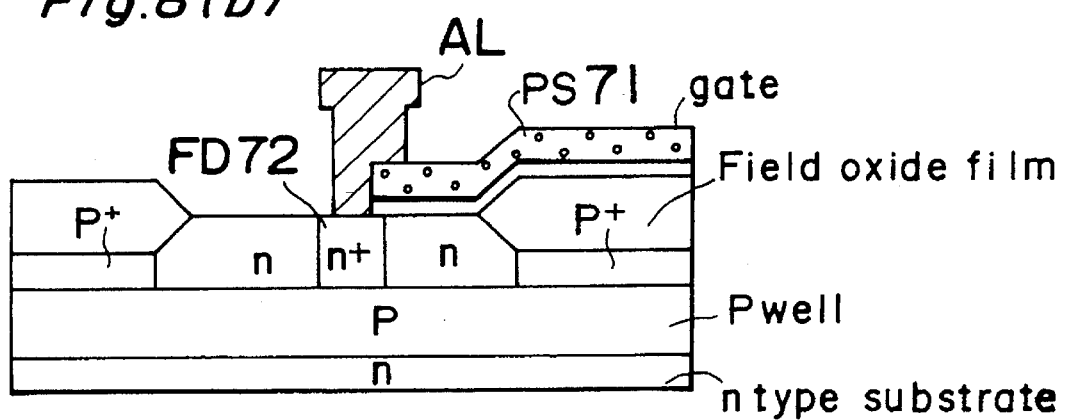
FIG. 8(b) is a sectional view along the line K—K' in FIG. 8(a)
Figure 14A:
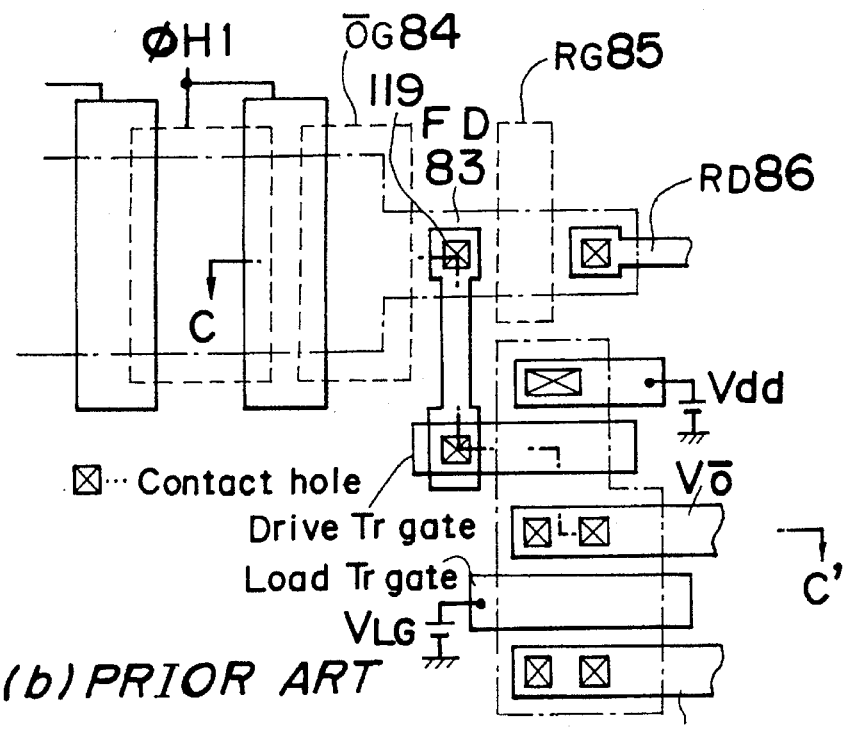
FIG. 14(a) is an enlarged plan view of the source follower part in the conventional charge detecting apparatus.
Figure 14B:
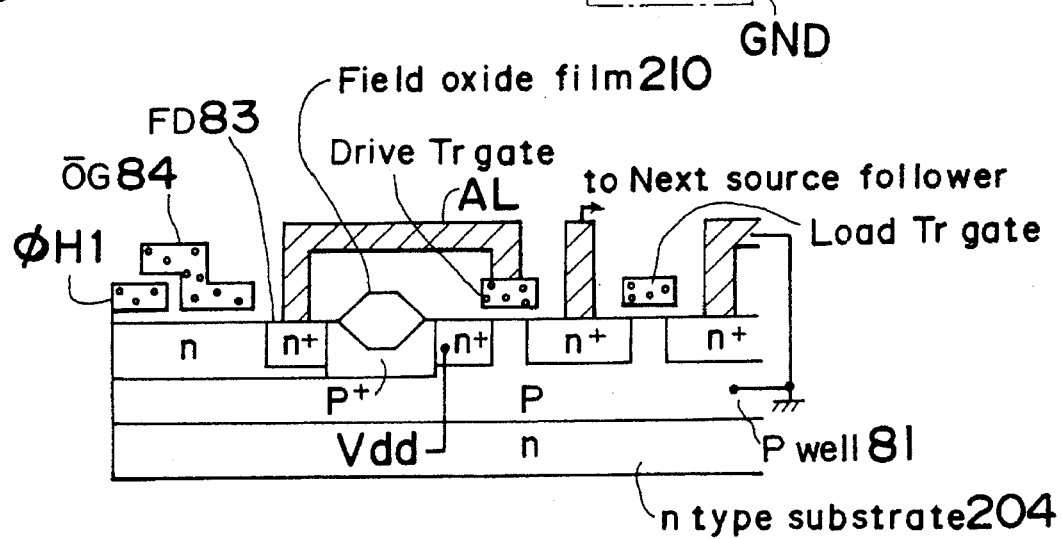
FIG. 14(b) is a sectional view along the line C—C' in FIG. 14(a)

FIGS. 8(a) and 8(b) are structural diagrams of the vicinity of an FD part in accordance with Embodiment 11 of the present invention. FIG. 8(a) is a plan view and FIG. 8(b) is a sectional view taken along the line K—K' of FIG. 8(a). The FD part has conventionally been obtained when the contact holes are formed (cf FIG. 14), and the PN junction capacitance $C_{PN}$ of the FD part is proportional to the size of the contact hole. It is a characteristic of Embodiment 11 that the polysilicon layer is overlapped with the contact hole, thereby to make the effective hole (contact area with the silicon substrate) small. As is clear from FIG. 8(a), in Embodiment 11, a gate PS71 of the first stage drive transistor is extended to FD72 and, a contact hole 70 is formed astride the gate PS71. FD72 is obtained as P and As are thermally diffused. Then, the gate PS71 is connected with the silicon substrate (FD72) by an AL wiring. Since a part of the contact hole 70 covered with the gate PS71 is not provided with an $n^+$ layer (except for the part spread by thermal diffusion), the $n^+$ layer formed on the silicon substrate becomes smaller than the conventional one. FIG. 8(b) indicates the final state when the $n^+$ layer is spread through thermal diffusion. In consequence to this, FD72 ($n^+$ layer) becomes equivalent to that the minimum size in the conventional process is greatly reduced, thus eliminating the PN junction capacitance on a large scale.

Figure 9A:
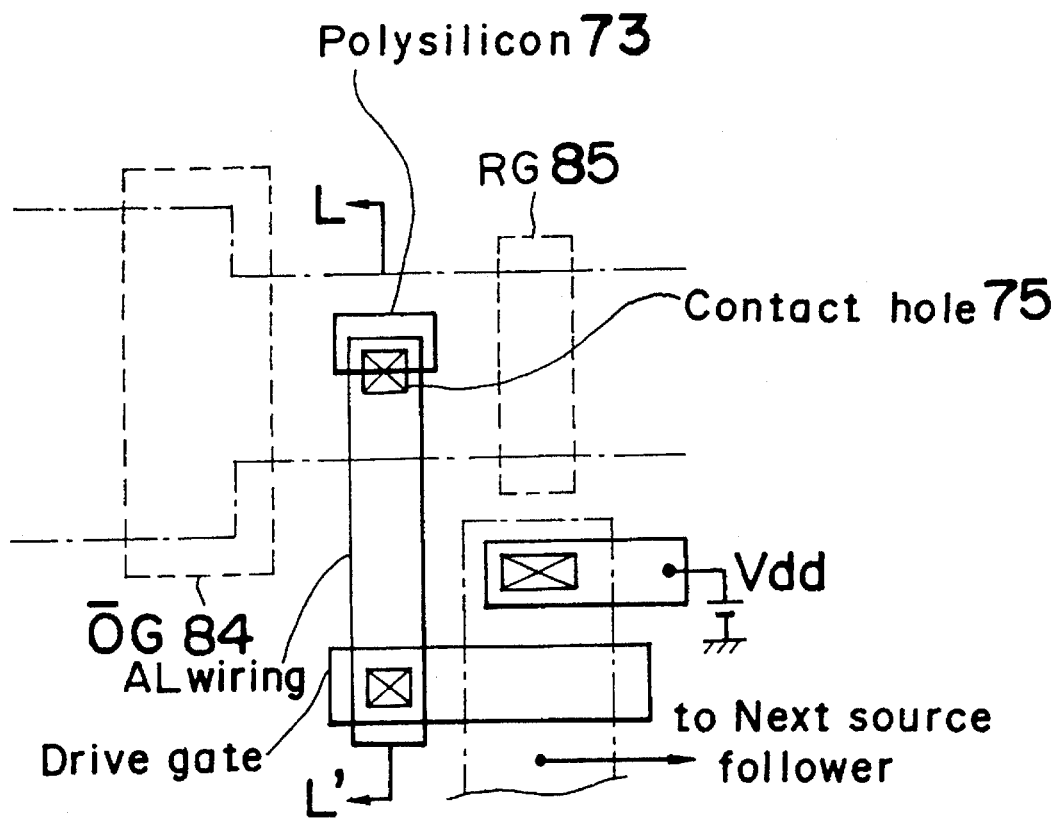
FIG. 9(a) is an enlarged plan view of a floating diffusion part in an electric charge detecting apparatus according to Embodiment 12 of the present invention.
Figure 9B:
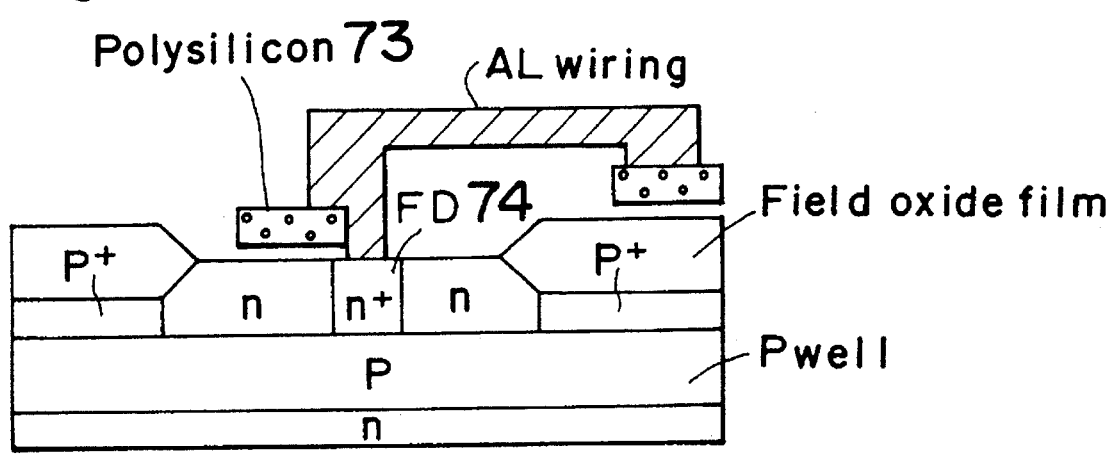
FIG. 9(b) is a sectional view along the line L—L' in FIG. 9(a)

FIGS. 9(a) and 9(b) are structural diagrams of the vicinity of an FD part in Embodiment 12 of the present invention. FIG. 9(a) is a plan view and FIG. 9(b) is a sectional view along the line L—L' of FIG. 9(a). Embodiment 12 is characterized in that a contact hole 75 is formed in a manner to stretch over the polysilicon layer and the silicon substrate. As is understood from FIG. 9(a), a polygon is formed of polysilicon on the FD part. The thus-formed polygonal polysilicon 73 may be any one of the polysilicon layer. As is clear from the cross section of FIG. 9(b), a contact hole 75 is formed covering both the polysilicon layer 73 and the silicon substrate. Therefore, P and As diffused when the contact hole is formed never enter a part covered with the polysilicon layer 73. FD74 is formed through diffusion of P and As and is spread by thermal diffusion, therefore increasing the area more or less than in the initial state. As a result, FD74 is rendered equivalent to that when the minimum size of the contact hole is considerably reduced, and the PN junction capacitance $C_{PN}$ is removed so much. The feature of Embodiment 12 is that the contact hole is formed on one polysilicon. For example, in the case where a plurality of polysilicons 73 are arranged and contact holes are formed in the gap of the polysilicons, the size of FD74 is determined according to the etching rule of the polysilicon. In Embodiment 12, however, the size of FD74 can be controlled by the overlapping amount of the contact hole 75 with the polysilicon 73, and moreover, the PN junction capacitance $C_{PN}$ is greatly eliminated.

Figure 10A:
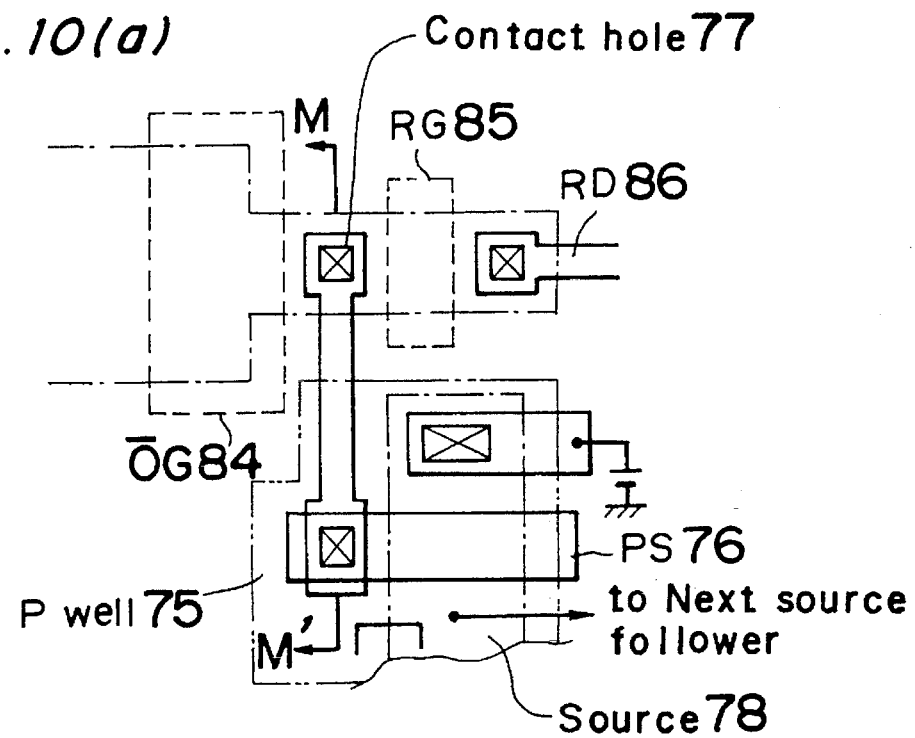
FIG. 10(a) is an enlarged plan view of a floating diffusion part in an electric charge detecting apparatus according to Embodiment 13 of the present invention.
Figure 10B:
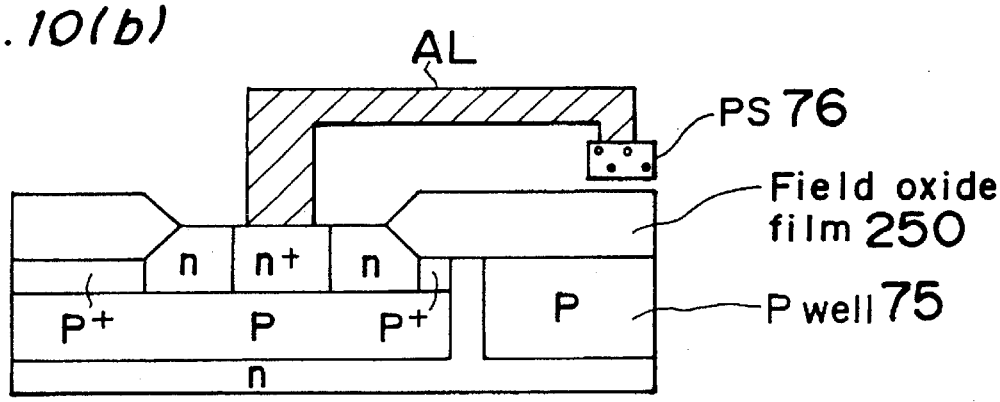
FIG. 10(b) is a sectional view along the line M—M' in FIG. 10(a)
Figure 11A:
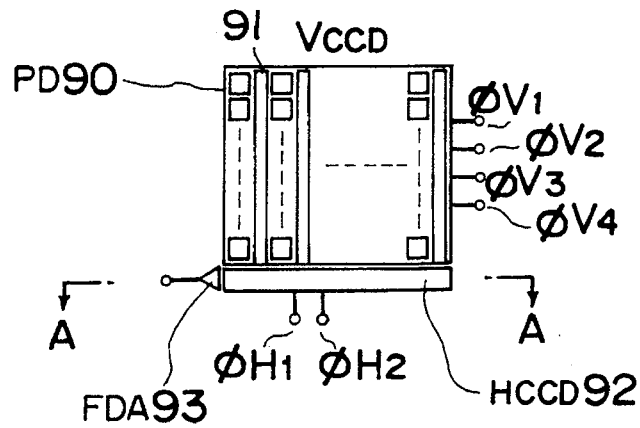
FIG. 11(a) is a block diagram of a conventional charge transfer device.
Figure 11B:
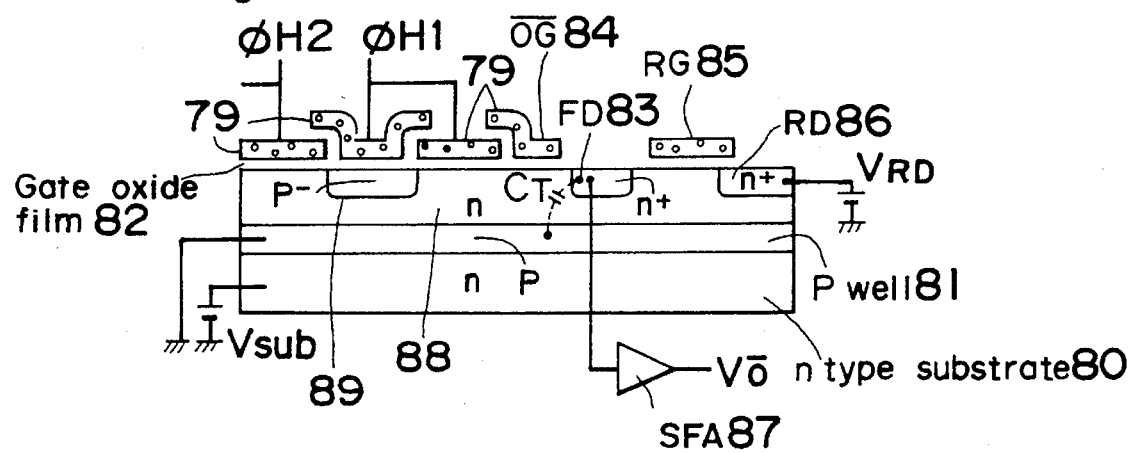
FIG. 11(b) is an enlarged sectional view along the line A—A' in FIG. 11(a)
Figure 13:
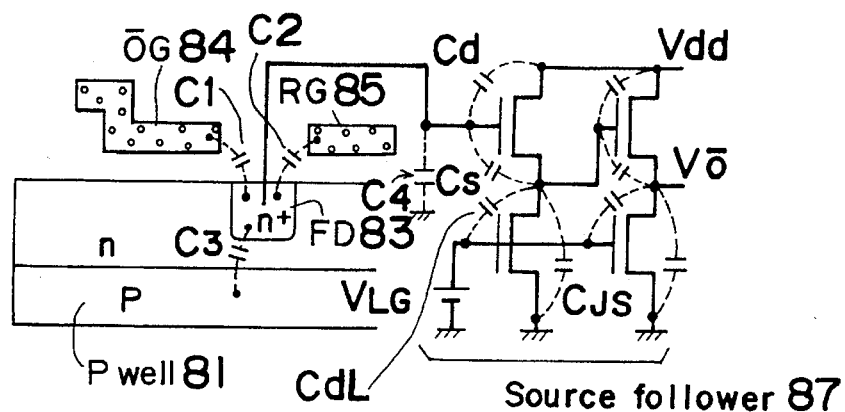
FIG. 13 is an explanatory view for showing parasitic capacitances related to P well part and source follower part in the conventional charge detecting apparatus.

FIGS. 10(a) and 10(b) are structural diagrams of the vicinity of an FD part in Embodiment 13 of the present invention. FIG. 10(a) is a plan view and FIG. 10(b) is a sectional view along the line M—M' of FIG. 10(a). In the aspect of Embodiment 13, a P well 75 of the drive transistor is extended from the FD part to below the AL wiring of the initial stage transistor. The forming method of the P well in Embodiment 9 is utilized for the above purpose. The P well 75 is connected with a source 78 of the drive transistor (FIG. 10(a)). The P well 75 is arranged below a gate PS76 of the drive transistor (below the field oxide film) from a contact hole 77. Therefore, the wiring capacitance C4 in the expression (2), supra, is the capacitance between the AL wiring part and the P well 75. Since the P well 75 is connected with the source 78 of the drive transistor in Embodiment 13, the above wiring capacitance C4 can be regarded as the capacitance between the gate and source of the drive transistor. The capacitance Cs between the gate and source is multiplied (1−G1) times as described in Embodiments 5–7, and its influence on the input capacitance can be reduced by manipulating G1 according to expression (3), supra. In other words, since the input capacitance is eliminated, the total parasitic capacitance $C_T$ is reduced. If the diffusion region ($n^+$) at the source side is extended to below the AL wiring, it brings about the same result.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electric charge detecting apparatus using a transistor for a source follower for detecting electric charges, said transistor comprising a source region;

a drain region;

a gate electrode of a first polysilicon layer corresponding to an effective channel; and a buffer electrode of a second polysilicon layer connected to either of said source or said drain region such that a coupling capacity between said gate electrode and either of said source region or said drain region is substantially determined by a coupling capacity between said gate electrode and said buffer electrode.

2. The electric charge detecting apparatus according to claim 1, wherein a process is employed to form a contact hole, during which, said source region and said drain region are also formed.

* * * * *